United States Patent [19]

Shimizu

[11] Patent Number: 4,631,724
[45] Date of Patent: Dec. 23, 1986

[54] SEMICONDUCTOR MEMORY TEST EQUIPMENT
[75] Inventor: Masao Shimizu, Gyoda, Japan
[73] Assignee: Advantest Corp., Tokyo, Japan
[21] Appl. No.: 734,109
[22] Filed: May 15, 1985
[30] Foreign Application Priority Data
May 23, 1984 [JP] Japan ................. 59-103882
[51] Int. Cl.[4] ........................................... G01R 31/28
[52] U.S. Cl. .................................. 371/21; 324/73 R; 365/201; 371/25
[58] Field of Search ............................ 371/21, 25, 27; 365/201; 324/73 R, 73 AT

[56] References Cited
U.S. PATENT DOCUMENTS 3,617,873 11/1971 Murray ...................... 365/201 X
4,233,668 11/1980 Yamaguchi et al. ........... 371/21 X
4,293,950 10/1981 Shimizu et al. ............... 371/21
4,497,056 1/1985 Sugamori ..................... 371/25
4,519,076 5/1985 Priel et al. ................... 371/21

Primary Examiner—Charles E. Atkinson
Attorney, Agent, or Firm—Staas & Halsey

[57] ABSTRACT

A semiconductor tester in which an address is generated by a test pattern generator in synchronism with an operating clock from a timing generator, the address is applied to a memory under test, and a check is made to determine if the power source current to the memory under test is larger than a predetermined value. A current value deciding circuit is provided, by which the power source current value is detected, and it is decided by a comparator whether the detected current value is greater than the predetermined value or not. The decision result is output at the timing of an output timing signal from the timing generator.

7 Claims, 6 Drawing Figures

SEMICONDUCTOR MEMORY TEST EQUIPMENT

BACKGROUND OF THE INVENTION

The present invention relates to semiconductor test equipment for testing characteristics of semiconductor memories, in particular, the operating power source current for each specified address of a semiconductor memory such as a CMOS memory.

In the testing of semiconductor memories, a test pattern and an expected value pattern are generated from a test pattern generator, the test pattern is applied to the memory under test and data available therefrom is compared with the expected value pattern, thereby deciding whether the memory under test is non-defective or defective.

It is well known that a CMOS memory, for example, is very small in power consumption. Accordingly, the CMOS memory is often used in the battery-driven mode. When the semiconductor is used in such a battery-driven mode, it is important how many hours the semiconductor memory can be operated from the battery. Therefore, it is required that power dissipation of the semiconductor memory will not exceed a predetermined value, and it is tested whether the power dissipation will exceed the predetermined value or not.

That is, in the case of testing characteristics of semiconductor memories of low power consumption, such as the CMOS memory and so on, it is necessary to make a test of their operating power source current so as to measure their power dissipation, in addition to an ordinary logic test, a DC test, etc. The operating power source current which flows into the semiconductor usually differs in value with addresses assigned thereto. Therefore, in conventional testing of such a power source current it is customary to decide an address of the memory under test to which particular attention is to be paid and to measure the current value at that address, or to measure the power source current at all addresses of the memory under test, examining at which address the operating power source current exceeds a predetermined value.

FIG. 1 illustrates in block form the arrangement of a conventional semiconductor memory tester of this kind. In FIG. 1, a test pattern generator 101 generates a test pattern 105 and an expected value pattern 107 in synchronism with a clock signal 103 from a timing generator 102. The test pattern 105 is composed of an address data, write data and control data for input into a memory under test 112. The test pattern 105 is applied to a waveform shaper 106, wherein it is shaped into a desired waveform, thereafter being provided therefrom to the memory under test 112. The expected value pattern 107 is supplied to a logic comparator 108, wherein it is logic-compared with the output signal from the memory under test 112. For example, as shown in FIG. 2 of U.S. Pat. No. 4,293,950 issued on Oct. 6, 1981, the test pattern and the expected value pattern are generated by executing a program transferred in advance from a central control unit 104 to the test pattern generator 101 via a bus line 119.

The timing generator 102 generates the clock signal 103 for the test pattern generator 101, a clock signal 110 for the waveform shaper 106 and a strobe signal 111 for determining the timing for comparison in the logic comparator 108, in accordance with periods and phases transferred in advance from the central control unit 104 to the timing generator 102 via the bus line 109 when a signal 109, which is applied thereto from the test pattern generator 101, is at the logic "0".

The waveform shaper 106 shapes the waveform of the test pattern 105 from the test pattern generator 101 into a test pattern 113 of a waveform, timing and an amplitude predetermined by the central control unit 104 via the bus line 119, and provides the pattern 113 to the memory under test 112. The logic comparator 108 makes a logic comparison between data 114 output from the memory under test 112 as a result of the application thereto of the test pattern 113 and the expected value pattern 107 from the test pattern 101, and the logic comparator 108 provides the comparison result 115 to the test pattern generator 101. When the comparison result 115 indicates noncoincidence between the output of the memory under test 112 and the expected value pattern 107, for instance, the signal 109 from the test pattern generator 101 is changed to logic "1" to halt the operation of the timing generator 102 and the memory under test 112 is removed as defective. Alternatively, the operation stop function may be set nonoperative and the comparison result 115 may be stored in a "defective" address memory (not shown) which is specified by the address of the test pattern 113 at that time.

In this way, the memory under test 112 is subjected to the logic test. In the test of such a semiconductor memory, it may sometimes necessary to measure the power source current flowing in the memory under test. This measurement is carried out in such a manner as follows: A power source circuit 116 generates a voltage predetermined by the central control unit 104 via the bus line 119 in accordance with the type of the memory under test 112, and provides the voltage via a current measuring circuit 118 to an operating power source terminal 121 of the memory under test 112. The current measuring circuit 118 measures the value of a current 117 which flows into the memory under test 112 from the power source circuit 116, and transfers the measured result as a digital value to the central control unit 104 via the bus line 119. The central control unit 104 decides whether the measured result is below a predetermined value or not, and then advances the test pattern to the next cycle.

That is, with such a conventional power source current measuring method, a series of test patterns for the memory under test 112 are caused to advance cycle by cycle under control of the central control unit 104 and when the address of the memory under test 112 to which the power source current is applied has reached the specified address to which particular attention is to be paid for measurement of the power source current, the central control unit 104 decides the measured result from the current measuring circuit 118. When the measured result is below a predetermined value, the central control unit 104 commands the test pattern generator 101 to proceed to the next cycle. If the measured current value is above the predetermined value, the memory under test 112 is decided as defective.

With such a conventional semiconductor memory test equipment, in the case of measuring the power source current of the memory under test, the central control unit 104 decides the measured value of the power source current for each cycle of the test pattern and then instructs the test pattern generator 101 to proceed to the next cycle, thus going ahead with the test. On account of this, the period of each cycle of the test pattern is lengthened, resulting in the defect of the test becoming time-consuming.

As described above, in the case of testing the power source current of the memory under test by the conventional semiconductor memory test equipment, the time for testing becomes long and this is marked especially in the case of testing large-capacity semiconductor memories. Therefore, the efficiency of testing has been low and the cost for testing has led to an appreciable increase in the manufacturing costs of semiconductor memories.

SUMMARY OF THE INVENTION

An object of the present invention is to provide a semiconductor memory test equipment with which it is possible to test the power source current of a memory under test in a short time.

According to the present invention, a current value deciding circuit is provided for deciding whether the power source current flowing in the memory under test is above a predetermined value or not. The value of current flowing in the memory under test from the power source circuit is detected and the detected current value is compared with a reference value, deciding whether it is above the predetermined value or not. The decision result is output in a prespecified arbitrary phase (timing) in each cycle of the test pattern.

Since the power source current value of the memory under test is decided by the current value deciding circuit, and not by the central control unit as described above, it is possible to save the time for control involved in the prior art for the decision of the current value by the central control unit and for proceeding to the next cycle of test pattern thereafter. Accordingly, the test can be carried out at a high speed by that. The decided results from the current value deciding circuits are applied to the test pattern generator, and when the result decided as exceeding the predetermined value is provided, the operation of the test pattern generator is stopped and the memory under test is decided as defective, or the decided results are sequentially stored in a memory and by examining the stored data, it is possible to detect at which address the current value exceeds the reference value.

Further, when the address at which the power source current is to be detected is reached, a decision command signal is provided from the test pattern generator to the current value deciding circuit, from which is obtained the decision result only when the decision command signal is present. Moreover, if necessary, the power source current is tested simultaneously with the logic test of the semiconductor memory.

Thus, the present invention permits high-speed processing of the test of the power source current, and hence cuts down the cost for the testing. Besides, according to the present invention, since the results of decision of the current value can be stored in a memory corresponding to the addresses of the memory under test, it is possible to easily analyze at which address the power source current exceeds the reference value.

DESCRIPTION OF THE PREFERRED EMBODIMENTS

Figure 1:
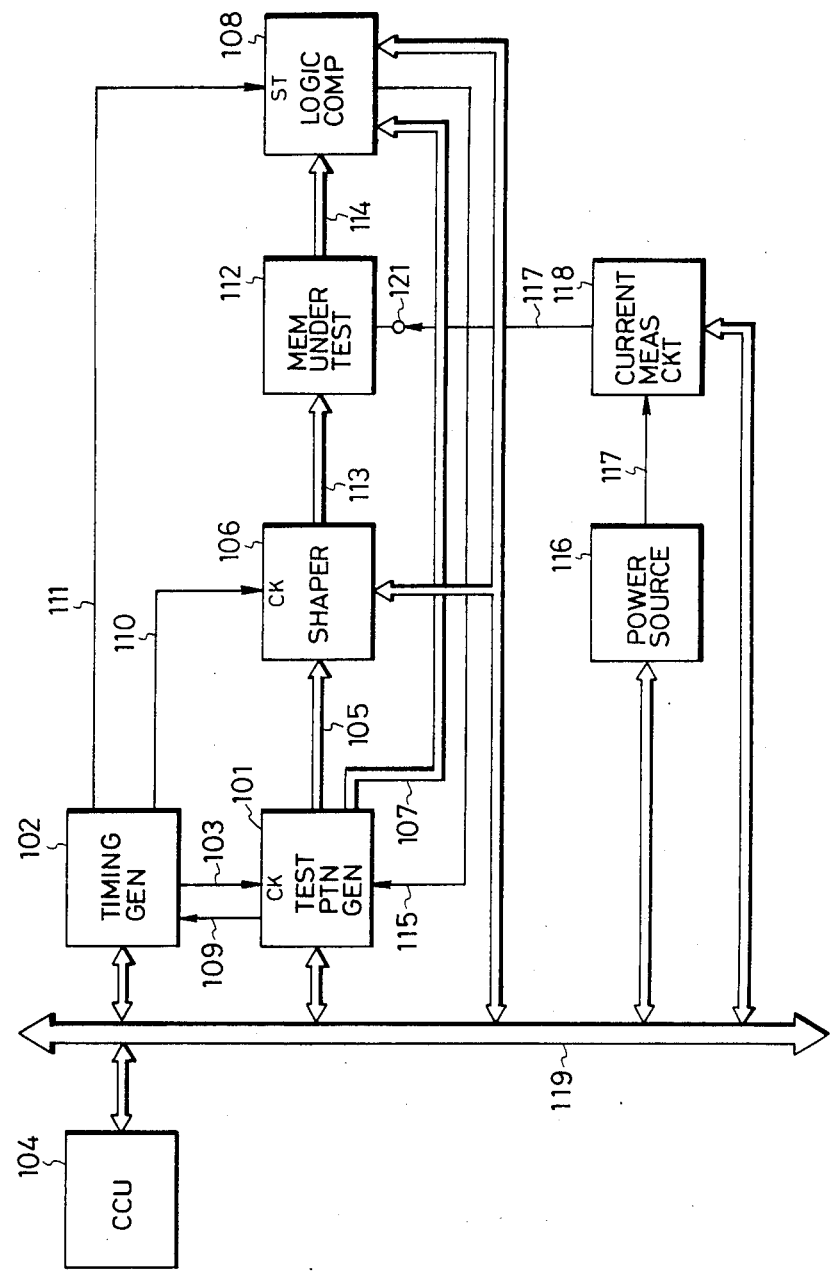
FIG. 1 is a block diagram illustrating the arrangement of a conventional semiconductor memory test equipment.
Figure 2:
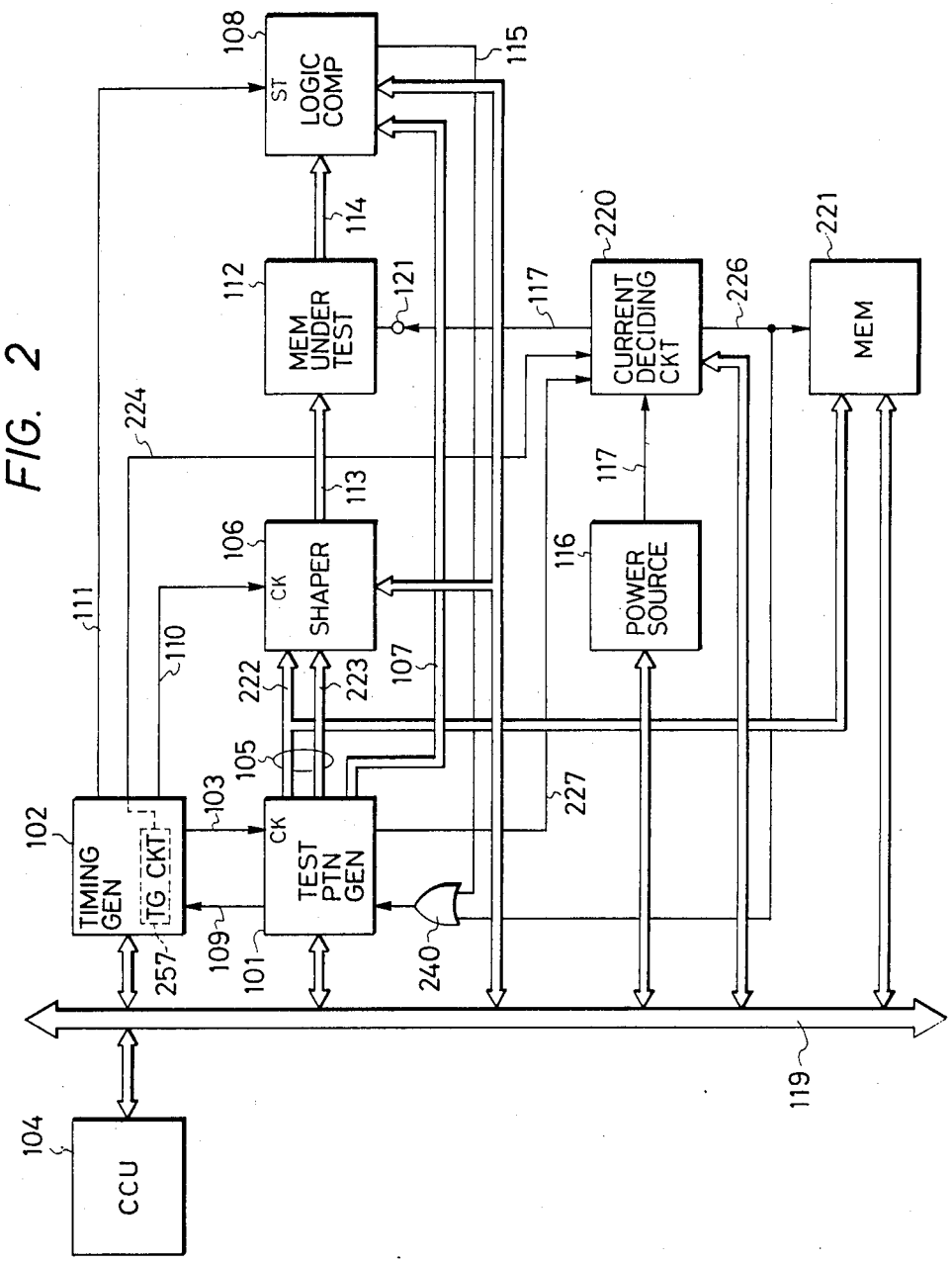
FIG. 2 is a block diagram illustrating an embodiment of the semiconductor memory test equipment of the present invention.

FIG. 2 illustrates the arrangement of an embodiment of the present invention. In FIG. 2, like parts corresponding to those in FIG. 1 are identified by the same reference numerals. The power source voltage from the power source circuit 116 is provided via a current value deciding circuit 220 to the power source terminal 121 of the memory under test 112. The current value deciding circuit 220 detects the value of current flowing from the power source circuit 116 into the memory under test 112 and compares the detected value with a reference value for decision. When supplied with an output timing signal 224 from the timing generator 102 to the current value deciding circuit 220 during each test cycle in a period during which a decision command signal 227 is being provided to the current value deciding circuit 220 from the test pattern generator 101, the current value deciding circuit 220 outputs a result of decision.

Figure 3:
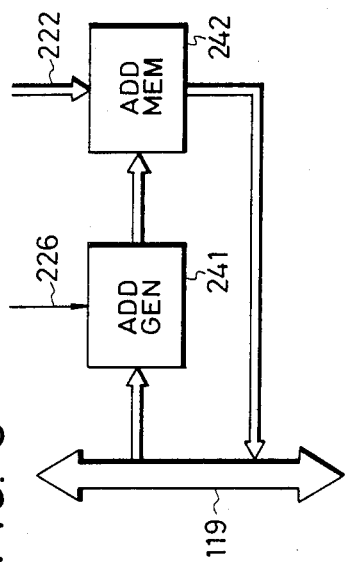
FIG. 3 is a block diagram showing a modification of one part of the test equipment shown in FIG. 2.

The decision result 226 from the current value deciding circuit 220 is provided via an OR circuit 240 to the test pattern generator 101, and when the decision result 226 indicates "defective", for example, the pattern generator 101 sets the signal 109 to logic "1" to stop the subsequent test pattern generation, ending the test. It is also possible, in this case, to preset such a test end function not to occur so that the test is continued regardless of the decision result 226 and the respective decision results 226 are successively stored in a memory 221. That is, address data 222 is provided from the test pattern generator 101 to the memory 221, wherein the decision results 226 are stored at addresses corresponding to those of the memory under test 112, respectively. Also it is possible to adopt such an arrangement as shown in FIG. 3 in which, only when the decision result 226 indicates "defective", is an address generator 241 controlled and a memory 242 addressed by an address from the address generator 241 to write therein the address 222 provided from the test pattern generator 101 at that time. After completion of the test, the decision results or addresses stored in the memory 221 or 242 are sequentially fetched therefrom into the central control unit 104 via the bus line 119, by which it is possible to detect at which addresses of the memory under test 112 the power source current flows thereinto in excess of the reference value.

Figure 4:
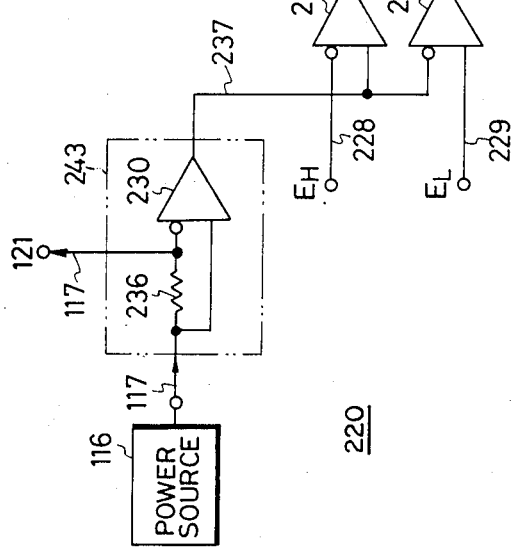
FIG. 4 is a circuit diagram illustrating a specific example of a current value deciding circuit used in FIG. 2.

FIG. 4 illustrates a specific example of the arrangement of the current value deciding circuit 220. The power source voltage from the power source circuit 116 is applied via a current detecting resistor 236 to the power source terminal 121 of the memory under test 112. A voltage proportional to the current i flowing into the memory under test 112 is obtained across the resistor 236, and the voltage is amplified by an amplifier 230. The resistor 236 and the amplifier 230 constitute a means 243 for detecting the power source current value. A signal from the amplifier 230, indicative of the detected current value, is applied to comparators 231 and 232, wherein it is compared with reference voltages 228($E_H$) and 229($E_L$) indicating the upper and lower limits of the current flowing into the memory under test 112, respectively. The comparison results by the comparators 231 and 232 are ORed by an OR circuit 233, and the ORed output 238 is provided to an AND circuit 234. In the case of detecting only whether the detected current value 237 is larger than a predetermined value, only the comparator 231 is used, and this constitutes the deciding means. When it is decided using the comparator 232 that the detected current value 237 is smaller than the predetermined value (close to zero), it can be judged that the memory under test 112 is out of operation because of a fault.

The AND circuit 234 is supplied at the other input terminal with the decision command signal 227 from the test pattern generator 101, and the AND circuit 234 supplies to a data terminal D of a flip-flop 235 the decision results for the cycles of the test patterns only when the decision command signal 227 is at the high level. To a clock terminal of the flip-flop 235 is being applied from the timing generator 102 an output timing signal 224 indicating the decision timing. The output timing signal 224 can be generated at an arbitrary phase in one cycle of each test pattern. At the timing of the output timing signal 224 the decision result is latched into the flipflop 235 and delivered therefrom as a decision result 226. The decision result 226 is provided to the test pattern generator 101, the memory 221 or the address generator 241, as referred to previously.

Though not shown in the drawings, data indicating the upper and lower limit values $E_H$, $E_L$ are stored in two registers of the current value deciding circuit 220 from the central control unit 104 (FIG. 2) via the bus line 119, and the stored data of the two registers are converted by D/A converters to analog signals, which are output as the reference voltages 228 and 229, respectively.

Figure 5:
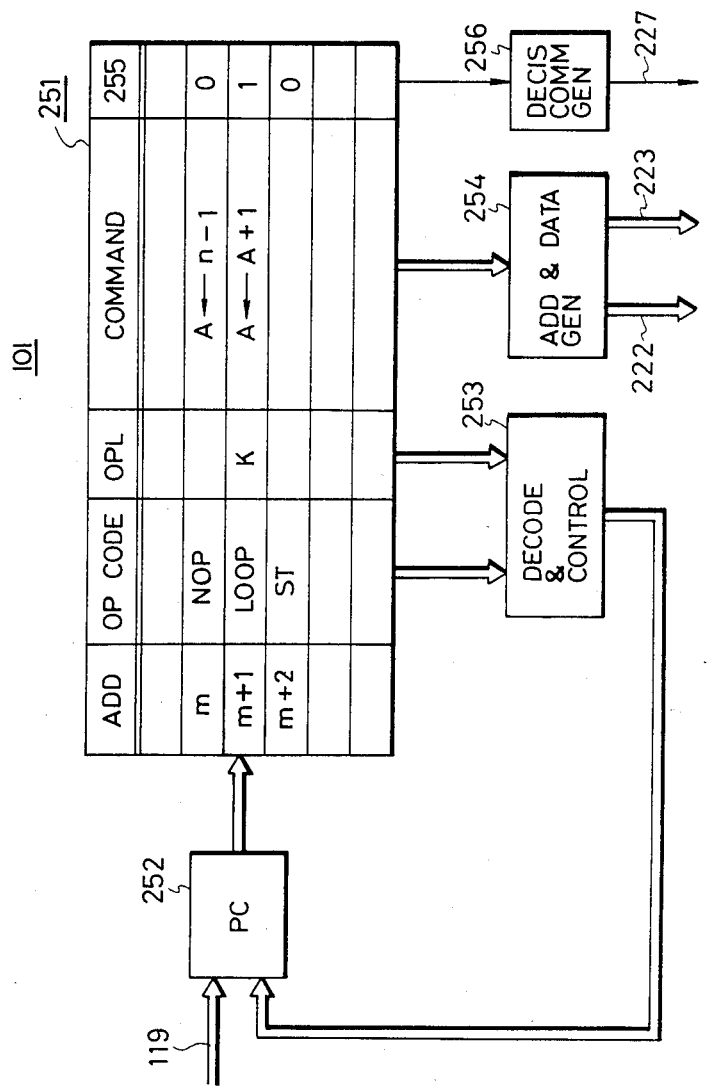
FIG. 5 is a block diagram illustrating a specific example of one part of a test pattern generator 101.

The decision command signal 227 is yielded from the test pattern generator 101 in such a manner, for example, as follows. The test pattern generator 101 has such an arrangement including an instruction memory as set forth in connection with FIGS. 2 and 3 of the aforementioned United States patent. In FIG. 5, an instruction memory 251 is read out at an address specified by a program counter 252 and a readout operation code is supplied to a decode and control 253. The decode and control part 253 interprets and executes the operation code to control the program counter 252. A command read out from the instruction memory 251 is provided to an address and data generator 254 to generate address 222 and data 223. For example, when a NOP instruction is read out from the address m designated by the program counter 252, the decode and control part 253 increments the program counter 252 by one to produce an address (m+1), at the same time, the address and data generator 254 generates an address n−1 in accordance with the command A←n−1. When a LOOP instruction which makes the program counter 252 generate the same address (m+1) k times is read out next, the address and data generator 254, sequentially increments the address by one, that is, generates addresses n, n+1, . . . and n+(k−1) in succession for respective test cycles in accordance with the command A←A+1. When a stop instruction ST is read out next, the generator 254 stops the address generating operation.

In this case, a plurality of cycles are needed for generating the first address (n−1), that is, preparatory steps for generating the address are needed, and the test of the memory under test may be sometimes desired to start at the address n. It is meaningless to measure the current value of the memory under test in the cycle of generation of the address (n−1). Accordingly, the addresses n, n+1, . . . and n+(k−1) are used as significant addresses at which the power source current values are to be decided. A decision command memory part 255 is provided in the instruction memory 251. A "0" is prestored in each of those parts of the memory part 255 which correspond to the addresses where the abovesaid NOP instruction and stop instruction are stored, and a "1" is prestored in the part corresponding to the address where the LOOP instruction is stored. The read output of the decision command memory part 255 is input into a decision command generating part 256, from which a low-level output (logic "0") is provided as the decision command signal 227 in the case of the read output is a "0", and a high-level output (logic "1") in the case of the read output is a "1".

The output command signal 224 is generated by the timing generator 102 in the following manner. The timing generator 102 is, for example, of the same construction as a timing generator 1 shown in FIG. 5 of U.S. Pat. No. 4,497,056 (issued Jan. 29, 1985), and a circuit 257 similar to its timing generating circuits $59_1$ to $59_4$ is provided. A set value for means of the circuit 256, which corresponds to a register 62 in the above-mentioned United States patent, is selected and the output command signal 224 is generated in an arbitrary phase in the test cycle.

Next, a description will be given, with reference to the timing chart of FIG. 6, of the operation of the above-described embodiment. In this embodiment, a check is made to determine if the current to the memory under test 112 is lower than L amperes at the addresses n, n+1, n+2 and n+3 of the memory 112.

Prior to the test, the following data is transferred from the central control unit 104 via the bus 119. To the timing generator 102 are transferred data indicating the period Ta of the operating clock for the test pattern generator 101, the waveform shaping circuit 106 and the logic comparator 108 and data indicating a delay time Tb for which the output timing signal 224 indicating the timing for decision in the current value deciding circuit 220 is delayed relative to the reference of the test cycle, i.e. the operating clock. To the test pattern generator 101 is transferred a program by which the decision command signal 227 is made logic "1" for commanding the current value deciding circuit 220 to compare and decide the power source current value only when the address data 222 are applied to the memory under test 112 in the order n, n+1, n+2, n+3 and the test cycles are those in which the addresses are n, n+1, n+2 and n+3. To the power source circuit 116 is transferred data indicating the power source voltage to be applied to the memory under test 112. To the current value deciding circuit 220 is transferred, as an upper limit reference voltage $E_H$ of the comparator 231, data indicating the reference current. When transferring a test start instruction to the test pattern generator 104 from the central control unit 104 via the bus line 119, the test pattern generator 104 generates the test pattern with the period Ta of the operating clock signal 103 applied thereto from the timing generator 102 and, at the same time, makes the decision command signal 227 high-level (logic "1") for causing the current value deciding circuit 220 to compare and decide the current value while the address data 222 in the test pattern is n, n+1, n+2 and n+3.

The address data 222, the write data and the control data 223 from the test pattern generator 101 are shaped by the waveform shaping circuit 106 into desired waveforms and then provided to the memory under test 112. The expected value pattern 107 from the test pattern generator 101 is applied to the logic comparator 108 for comparison with the output data 114 from the memory under test 112. The comparison result 115 from the logic comparator 108 is provided via the OR circuit 240 to the test pattern generator 102, and when the comparison result 115 indicates noncoincidence, the generation of the test pattern is stopped. In this way, the logic test is made for each address of the memory under test 112.

To the power source terminal 121 of the memory under test 112 is applied a predetermined voltage from the power source circuit 116 via the current value deciding circuit 220. The memory 221 is supplied with the address data 222 in the test pattern from the test pattern generator 101 and the decision result 226 from the current value deciding circuit 220. The data stored in the memory 221 is read out by the central control unit 104 via the bus line 119.

The current value deciding circuit 220 converts, by the resistor 236 (FIG. 4), the power source current i to the memory under test 112 into voltage and detects the power source current value after amplifying the voltage by the amplifier 230 to a desired value. The detected current value 237 from the amplifier 230 reaches a peak value at the address switching point of time and then gradually decreases into a stable state, as shown in FIG. 6. In the case of a CMOS memory or the like, a large current usually flows at the address switching point of time, but the current flowing in the steady state is small. Since the steady state period is longer than the transition period at the time of address switching, the total power consumption of the memory is greatly affected by the current value in the steady state. Accordingly, in the example shown in FIG. 6, the output timing signal 224 is generated so that the decision is made at the time Tb after the occurrence of the operating clock signal 103.

The detected current value from the amplifier 230 is compared with the reference values in the comparators 231 and 232, respectively. In this example, the reference voltage 228 corresponding to the reference current is supplied as the upper limit reference value to the comparator 231. When the address data goes to n, the decision command signal 227 assumes the logic "1", enabling the AND circuit 234 of the current value deciding circuit 220 to permit the passage therethrough of the output of the OR circuit 233. In consequence, the compared-decided result of the detected current value is provided from the comparator 231 to the flip-flop 235 and input thereinto at the timing of the output timing signal 224.

In this example, since the addresses at which the current value is to be checked are n, n+1, n+2 and n+3, the decision command signal 227 remains low-level until the address data n−1, but when the address data reaches n, the decision command signal 227 becomes high-level and upon each occurrence of the output timing signal 224, the decision result of the current value is produced. In FIG. 6, the detected current value from the amplifier 230 in the cycle of the address n+3 is greater than the reference voltage 228 at the occurrence of the output timing signal 224. Accordingly, the compared-decided result from the comparator 231 at that moment is input by the output timing signal 224 into the flip-flop 235, and the decision result 226 from the flip-flop 235 becomes high-level, indicating "defective".

When the decision result 226 is "defective", the test pattern generator 101, for instance, stops the test and decides that the memory under test is defective, thereafter commencing the test of the next memory under test. It is also possible, in this case, to preset the test pattern generator 101 so that its stop function will not be performed even if the decision result 226 is "defective", and in such a case, the test is continued and the subsequent decision results 226 are sequentially stored in the memory 221. Also it is possible to store in the memory 242 the address 222 in the case of the decision result 226 being "defective", as described previously with respect to FIG. 3.

In the case of checking at which address of the memory under test 112 a current flows in excess of the reference value, a program which generates all addresses of the memory 112 is executed and the current value is decided at all the addresses by the current value deciding circuit 220. For example, the decision command signal 227 is always held at the logic "1", or the output 238 of the OR circuit 233 is applied directly to the data terminal D of the flip-flop 235. By sequentially storing the decision results 226 from the current value deciding circuit 220 in the memory 221, or by storing in the memory 242 the addresses at which the decision results are "defective" and by reading out the stored data of the memory 221 or 242 under control of the central control unit 104, it is possible to examine at which address a power source current exceeding the reference value flowed.

As described above, according to the present invention, in the case of deciding whether or not the power source current value of a memory under test is larger than a predetermined value while sequentially switching addresses for access to the memory, the current value deciding circuit is provided for detecting and deciding the power source current value and the timing for outputting the decision results is specified by the timing generator, and if necessary, it is indicated by the test pattern generator whether or not the current address is an address at which the decision is to be made. Accordingly, the decision as to whether the power source current value is greater than the predetermined value or not can be made independently of the central control unit, and this permits speed up of the test.

Further, since the decision results of the power source current value of the memory under test, thus obtained, are stored at the corresponding addresses of the memory 221, or since the addresses at which the decision results are "defective" are stored in the memory 242, the results of the test can easily be analyzed.

Moreover, by employing such an arrangement as shown in FIG. 4 which permits the comparator 232 to decide that the detected power source current value is substantially zero or smaller, it is possible to detect that the memory under test 112 is inoperative because of a failure and to stop the test by applying the output of the comparator 232 to the OR circuit 240 in FIG. 2. In the above embodiment a logic test can also be made simultaneously with the power source current value decision test.

Figure 6:
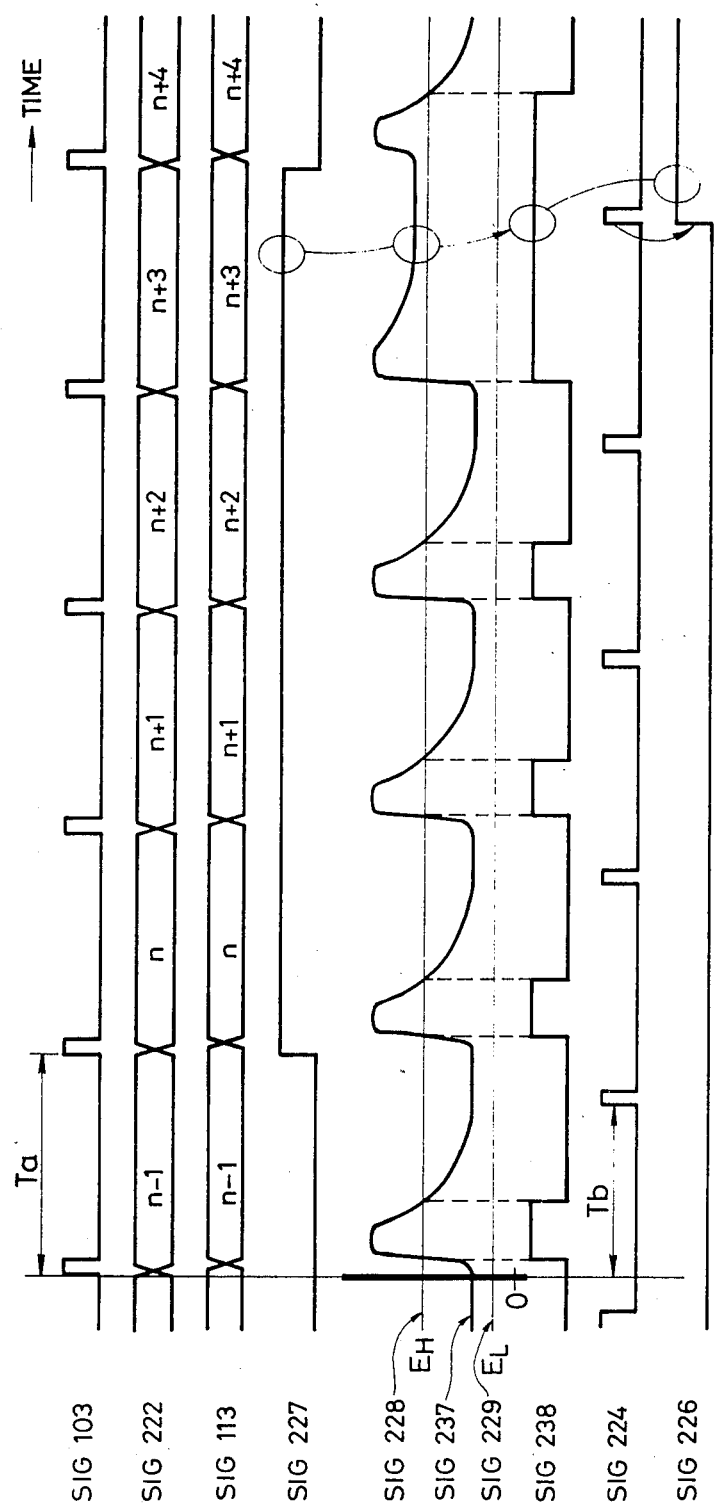
FIG. 6 is a timing chart showing an example of the operation of the equipment depicted in FIG. 2.

It has been described with regard to FIG. 6 that the period of the test pattern from the test pattern generator has the fixed value Ta both in the case of an address at which the power source current value is decided and in the case of other addresses at which the power source current value is not decided. However, it is also possible to adopt such an arrangement that in the cycles of the addresses n, n+1, n+2 and n+3 at which the power source current value is decided, the period of generation of the test pattern is selected to be, for example, Ta in view of the measuring rate of the current value deciding circuit 220, whereas in the case of making the logic test for the other addresses, only the logic test is effected at a high speed disregarding the measuring rate of the current value deciding circuit 220 and the setting of the phase for providing the decided output by the output timing signal 224. This permits further reduction of the time needed for the test.

In FIG. 4, the AND circuit 234 and the flip-flop 235 can be exchanged in position. In short, the arrangement used needs only to output the decision result at the timing of the output timing signal while the decision command signal is at the logic "1".

Also it is possible to employ an arrangement in which a plurality of registers are provided in the test pattern generator 101 for setting the addresses at which the power source current value is to be decided and the decision command signal 227 is provided when coincidence is detected between each of the addresses and the address 222 from the test pattern generator 101.

It will be apparent that many modifications and variations may be effected without departing from the scope of the novel concepts of the present invention.

What is claimed is:

1. Semiconductor memory test equipment comprising:
   a timing generator for generating an operating clock of a set period and an output timing signal of a phase set relative to the operating clock;
   a test pattern generator supplied with the operating clock, for generating addresses and applying them to a memory under test with the period of the operating clock;
   a power source circuit for supplying a power source current necessary for operation of the memory under test; and
   a current value deciding circuit including
      a current value detecting means for detecting the value of the power source current being supplied to the memory under test,
      a deciding means for deciding, by comparison, whether the detected current value is greater than a predetermined value, and
      an output means responsive to the output timing signal from the timing generator to output the decision result from the deciding means at the timing of the output timing signal.

2. Semiconductor memory test equipment according to claim 1 wherein the decision result output from the output means is supplied to the test pattern generator, and a stop means is provided for stopping the operation of the test pattern generator when the decision result indicates that the detected current value is greater than the predetermined value.

3. Semiconductor memory test equipment according to claim 1, which includes a memory accessed by the address from the test pattern generator, for storing the decision result output from the output means.

4. Semiconductor memory test equipment according to claim 1 which includes a memory for storing the address output from the test pattern generator whenever the output means outputs the decision result deciding that the detected current value is greater than the predetermined value.

5. Semiconductor memory test equipment according to any one of claims 1 to 4 wherein the test pattern generator includes a means for outputting a decision command signal during a period in which addresses at which the power source current value is to be decided are generated, and wherein the current value deciding means includes a means supplied with the decision command signal, for enabling the output means to output the decision result while the decision command signal is present.

6. Semiconductor memory test equipment according to claim 5 wherein
   the test pattern generator includes an expected value generating means for generating expected value data simultaneously with the address generation,
   said timing generator outputs a strobe signal, and
   a logic comparator is provided for comparing output data from the memory under test and the expected value data from said expected value generating means at the timing of the strobe signal applied thereto from the timing generator, said logic comparator being operative simultaneously with the test for deciding the power source current value.

7. Semiconductor memory test equipment according to claim 5 which includes
   second deciding means for deciding whether the detected current value of the current value detecting means is smaller than a second predetermined value, and
   means for stopping the operation of the test pattern generator by the output of the second deciding means when it is decided by the second deciding means that the detected current value is smaller than the second predetermined value.

* * * * *